(12) United States Patent
Ichikawa

(10) Patent No.: US 9,761,668 B2
(45) Date of Patent: Sep. 12, 2017

(54) SEMICONDUCTOR DEVICE

(71) Applicant: ROHM CO., LTD., Kyoto (JP)

(72) Inventor: Daisuke Ichikawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/148,612

(22) Filed: May 6, 2016

(65) Prior Publication Data

US 2016/0329425 A1    Nov. 10, 2016

(30) Foreign Application Priority Data

May 8, 2015 (JP) ................................. 2015-095988
Apr. 22, 2016 (JP) ................................. 2016-086419

(51) Int. Cl.
| | |
|---|---|
| H01L 29/10 | (2006.01) |
| H01L 29/78 | (2006.01) |
| H01L 29/08 | (2006.01) |
| H01L 29/06 | (2006.01) |
| H01L 29/40 | (2006.01) |
| H01L 29/423 | (2006.01) |

(52) U.S. Cl.
CPC ...... *H01L 29/1095* (2013.01); *H01L 29/0692* (2013.01); *H01L 29/0847* (2013.01); *H01L 29/7835* (2013.01); *H01L 29/063* (2013.01); *H01L 29/1083* (2013.01); *H01L 29/404* (2013.01); *H01L 29/42368* (2013.01)

(58) Field of Classification Search
None
See application file for complete search history.

(56) References Cited

U.S. PATENT DOCUMENTS

| | | |
|---|---|---|
| 6,897,525 B1 | 5/2005 | Kikuchi et al. |
| 2002/0005550 A1 | 1/2002 | Takahashi et al. |
| 2002/0190309 A1 | 12/2002 | Takahashi et al. |
| 2005/0127438 A1* | 6/2005 | Hossain .............. H01L 29/0696 257/341 |

(Continued)

*Primary Examiner* — Charles Garber
*Assistant Examiner* — Alia Sabur
(74) *Attorney, Agent, or Firm* — Rabin & Berdo, P.C.

(57) ABSTRACT

A semiconductor device includes a first conductivity type semiconductor substrate, a second conductivity type semiconductor layer which is formed on the semiconductor substrate so as to be in contact with the semiconductor substrate, a first conductivity type body region which is formed in a front surface portion of the semiconductor layer, a second conductivity type source region which is formed in a front surface portion of the body region, a second conductivity type drain region which is formed apart from the body region, a gate insulating film which is formed in a front surface of the semiconductor layer so as to be in contact with the body region, a thick insulating film which is formed integrally with the gate insulating film so as to cover the semiconductor layer between the gate insulating film and the drain region and a gate electrode which is opposite to the body region via the gate insulating film. The body region includes a first portion in which a boundary with the semiconductor layer is in contact with the gate insulating film and a second portion in which a boundary with the semiconductor layer is in contact with the thick insulating film.

24 Claims, 11 Drawing Sheets

(56) References Cited

U.S. PATENT DOCUMENTS

| | | | |
|---|---|---|---|
| 2009/0242981 A1* | 10/2009 | Fujita | H01L 29/0696 257/335 |
| 2011/0233668 A1* | 9/2011 | Obatake | H01L 29/0653 257/335 |
| 2011/0241112 A1* | 10/2011 | Zuniga | H01L 29/1095 257/343 |
| 2011/0284956 A1 | 11/2011 | Satou et al. | |
| 2015/0221720 A1* | 8/2015 | Mallikarjunaswamy | H01L 29/0619 257/495 |

* cited by examiner

SEMICONDUCTOR DEVICE

BACKGROUND OF THE INVENTION

1. Field of the Invention

The present invention relates to a semiconductor device.

2. Description of the Related Art

US2011/0284956A1 discloses a semiconductor device that includes an LDMOS (Laterally Diffused MOS)-type transistor. This semiconductor device includes a p-type semiconductor substrate, an n-type semiconductor layer that is formed on the semiconductor substrate, a p-type drain offset region that is formed in a front surface portion of the semiconductor layer, an n-type body region that is formed in the front surface portion of the semiconductor layer so as to penetrate the drain offset region, a p-type source region that is formed in a front surface portion of the body region, a p-type drain region that is formed apart from the body region, a gate insulating film that is formed on the drain offset region so as to cross the body region from an end portion of the source region on the side of the drain region, a thick insulating film that is formed on the drain offset region between the gate insulating film and the drain region and a gate electrode that is formed on the gate insulating film. In this configuration, a boundary between the body region and the semiconductor layer is in contact with the gate insulating film.

SUMMARY OF THE INVENTION

A preferred embodiment of the present invention provides a semiconductor device including: a first conductivity type semiconductor substrate; a second conductivity type semiconductor layer which is formed on the semiconductor substrate so as to be in contact with the semiconductor substrate; a first conductivity type body region which is formed in a front surface portion of the semiconductor layer; a second conductivity type source region which is formed, in a front surface portion of the body region, apart from a circumferential edge of the body region; a second conductivity type drain region which is formed, in the front surface portion of the semiconductor layer, apart from the body region; a gate insulating film which is formed in a front surface of the semiconductor layer so as to be in contact with the body region between the drain region and the source region; a thick insulating film which is formed integrally with the gate insulating film so as to cover the semiconductor layer between the gate insulating film and the drain region and which has a thickness greater than a thickness of the gate insulating film; and a gate electrode which is opposite to the body region via the gate insulating film between the source region and the drain region. In this configuration, the body region includes a first portion in which a boundary with the semiconductor layer is in contact with the gate insulating film and a second portion in which a boundary with the semiconductor layer is in contact with the thick insulating film.

These and further objects, features and advantages of the present invention will become more apparent from the following description of preferred embodiments with reference to accompanying drawings.

DETAILED DESCRIPTION OF THE PREFERRED EMBODIMENTS

Figure 1:
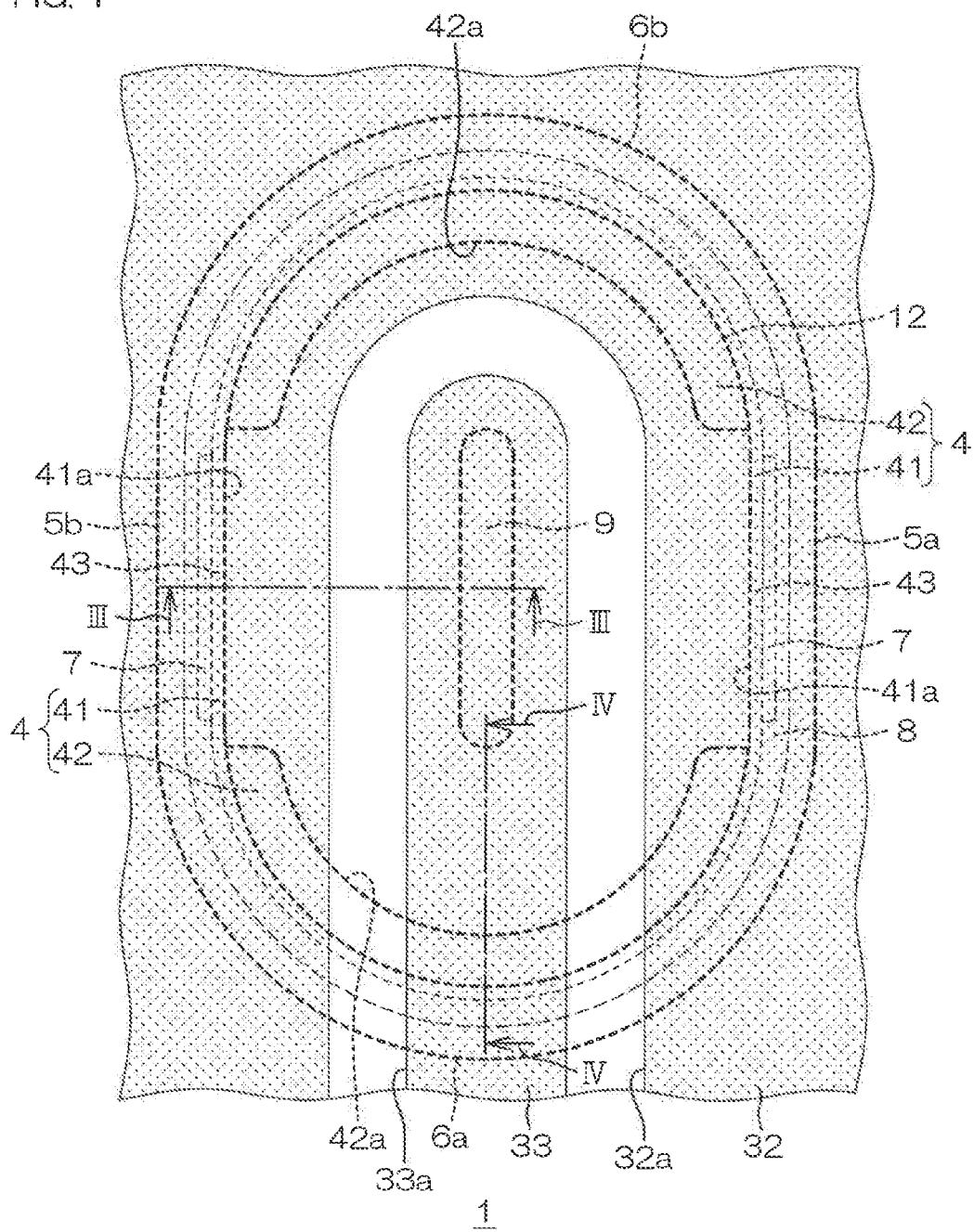
FIG. 1 is a plan view of a semiconductor device according to a first preferred embodiment of the present invention.

As in US2011/0284956A1, in a configuration in which a boundary between a body region and a semiconductor layer is in contact with a gate insulating film, when a high voltage such as a surge voltage is applied between a drain region and a source region, a breakdown occurs in the boundary between the body region and the semiconductor layer in contact with the gate insulating film. More specifically, an electric field is concentrated in an end portion of the body region located on the side of the drain region, and thus a breakdown occurs in the semiconductor layer in the vicinity of the end portion of the body region. In this case, the gate insulating film may be damaged by being influenced by a high electric field, hot carriers (carriers accelerated by the high electric field) and the like caused by the breakdown. When the gate insulating film is damaged, since the durability of a semiconductor device, for example, properties such as a static electricity tolerance are varied and moreover, a gate electrode cannot properly apply an electric field to the body region, with the result that properties of the semiconductor device such as the threshold voltage and the leakage current may also be varied.

Therefore, a preferred embodiment of the present invention provides a semiconductor device is that suppresses variations in properties caused by the damage to a gate insulating film resulting from a breakdown and that can thereby enhance the reliability.

A preferred embodiment of the present invention provides a semiconductor device including, a first conductivity type semiconductor substrate, a second conductivity type semiconductor layer which is formed on the semiconductor substrate so as to be in contact with the semiconductor substrate, a first conductivity type body region which is formed in a front surface portion of the semiconductor layer, a second conductivity type source region which is formed, in a front surface portion of the body region, apart from a circumferential edge of the body region, a second conductivity type drain region which is formed, in the front surface portion of the semiconductor layer, apart from the body region, a gate insulating film which is formed in a front surface of the semiconductor layer so as to be in contact with the body region between the drain region and the source region, a thick insulating film which is formed integrally with the gate insulating film so as to cover the semiconductor layer between the gate insulating film and the drain region and which has a thickness greater than a thickness of the gate insulating film and a gate electrode which is opposite to the body region via the gate insulating film between the source region and the drain region. In this configuration, the body region includes a first portion in which a boundary with the semiconductor layer is in contact with the gate insulating film and a second portion in which a boundary with the semiconductor layer is in contact with the thick insulating film.

In this configuration, the first portion forms a channel to form a current path between the first portion and the semiconductor layer. On the other hand, in the second portion, since in the portion in contact with the thick insulating film, almost no channels are formed, a current path is not formed between the second portion and the semiconductor layer. In other words, the second portion hardly contributes to the properties of the semiconductor device such as the threshold voltage and the leakage current. In the semiconductor layer, an electric potential gradient is produced from the source region toward the drain region, and an electric field greater than an electric field applied to the boundary with the semiconductor layer in the first portion is applied to the boundary with the semiconductor layer in the second portion which is relatively closer to the drain region. In other words, the electric field strength applied to the boundary with the semiconductor layer in the first portion is relatively reduced due to the second portion.

Therefore, when a high voltage such as a surge voltage is applied between the drain region and the source region, since its load is concentrated in the second portion, it is possible to preferentially break down the second portion as compared with the first portion. In this way, a high electric field, hot carriers (carriers accelerated by the high electric field) and the like caused by the breakdown can be concentrated in the second portion. Consequently, since it is possible to avoid or suppress the breakdown in the first portion, it is possible to suppress the damage to the gate insulating film in contact with the first portion.

On the other hand, since in the second portion, the boundary with the semiconductor layer is in contact with the thick insulating film, it is possible to suppress the concentration of the load in the gate insulating film in contact with the second portion. In this way, it is also possible to suppress the damage to the gate insulating film in contact with the second portion. Consequently, it is possible to provide a semiconductor device that suppresses variations in properties caused by the damage to the gate insulating film resulting from the breakdown and that can thereby enhance the reliability.

Preferably, in the semiconductor device described above, the second portion of the body region is formed in a portion other than a portion between the source region and the drain region in the body region.

In this configuration, since the second portion is formed in the portion other than the portion between the source region and the drain region, it is possible to effectively suppress the formation of a channel in the second portion. Moreover, the location of the body region where the breakdown occurs can be separated away from the first portion. In this way, it is possible to effectively avoid or suppress the occurrence of the breakdown in the first portion.

Preferably, in the semiconductor device described above, a plurality of the second portions are formed. In this configuration, since a plurality of second portions can be broken down, the load resulting from the breakdown can be dispersed in the plurality of second portions. In this way, it is possible to reduce the load per second portion, and thus it is possible to effectively suppress variations in properties caused by the damage to the gate insulating film resulting from the breakdown while effectively avoiding or suppressing the occurrence of the breakdown in the first portion.

In the semiconductor device described above, the first portion and the second portion of the body region may be formed in a portion between the source region and the drain region in the body region. In this configuration, in the portion between the source region and the drain region in the body region, the second portion is formed, and thus it is possible to reduce a risk of occurrence of a breakdown of the first portion in the portion where the source region is opposite to the drain region.

In the semiconductor device described above, a plurality of the first portions and the second portions may be alternately formed in the portion between the source region and the drain region in the body region. In this configuration, it is possible to effectively reduce a risk of occurrence of a breakdown of the first portion in the portion where the source region is opposite to the drain region.

In the semiconductor device described above, the body region may be formed in the shape of a ring in plan view when viewed from a normal direction to the front surface of the semiconductor layer.

In the semiconductor device described above, the body region may be formed, in plan view when viewed from a normal direction to the front surface of the semiconductor layer, in a shape of an oval ring which has a pair of straight parts parallel to each other and a pair of curved parts respectively continuous to both ends of the pair of straight parts, the source region may be formed along at least one of the straight parts of the body region and the second portion of the body region may be formed along at least one of the curved parts.

Preferably, in the semiconductor device described above, the second portion of the body region is formed so as to straddle at least a boundary between the straight part and the curved part in the body region. In the body region, there is a tendency that in the portion straddling the boundary between the straight parts and the curved parts, the electric field is disturbed or concentrated. Thus, a breakdown is more likely to occur than other portions. Therefore, in this configuration, the second portion is formed so as to straddle at least the boundary between the straight parts and the curved parts. In this way, even if a breakdown occurs in the portion straddling the boundary between the straight parts and the curved parts, such a breakdown occurs in the second portion which hardly influences the properties of the semiconductor device. As described above, the second portion is provided in the location where a breakdown easily occurs, and thus it is possible to effectively suppress variations in properties caused by the damage to the gate insulating film resulting from the breakdown while suppressing the occurrence of the breakdown in the first portion.

In the semiconductor device described above, a plurality of the source regions may be formed in the front surface portion of the the body region.

In the semiconductor device described above, the body region and the source region may be formed in the shape of a ring in plan view when viewed from a normal direction to the front surface of the semiconductor layer.

In the semiconductor device described above, a plurality of the second portions may be formed. In this configuration, since a plurality of second portions can be broken down, the load resulting from the breakdown can be dispersed in the plurality of second portions. In this way, it is possible to reduce the load per second portion, and thus it is possible to effectively suppress variations in properties caused by the damage to the gate insulating film resulting from the breakdown while effectively avoiding or suppressing the occurrence of the breakdown in the first portion.

In the semiconductor device described above, a plurality of the second portions may be formed apart from each other such that a plurality of the first portions are arranged at regular intervals.

Preferably, in the semiconductor device described above, the gate electrode is continuously formed from the top of the gate insulating film to the top of the thick insulating film, and the boundary with the semiconductor layer in the second portion is located between the gate insulating film and an end portion of the gate electrode on the side of the drain region.

In this configuration, since the boundary of the semiconductor layer in the second portion is located between the gate insulating film and the end portion of the gate electrode on the side of the drain region, it is possible to increase the electric field strength in the boundary of the semiconductor layer in the second portion. In this way, it is possible to relatively further reduce the electric field strength in the first portion. Consequently, it is possible to effectively suppress variations in properties caused by the damage to the gate insulating film resulting from the breakdown while effectively avoiding or suppressing the occurrence of the breakdown in the first portion.

The semiconductor device described above may include a source wiring which is formed, in plan view when viewed from a normal direction to the front surface of the semiconductor layer, so as to cross the body region and which is electrically connected to the source region. Preferably, in this configuration, the second portion of the body region is formed, in the plan view, in a portion where at least a circumferential edge of the source wiring crosses the body region.

There is a tendency that in the portion of the semiconductor layer where the circumferential edge of the source wiring crosses the body region in plan view, the electric field is disturbed or concentrated. Thus, a breakdown is more likely to occur than other portions. Therefore, in this configuration, the second portion is formed in the portion where the circumferential edge of the source wiring crosses the body region at least in plan view. In this way, even if a breakdown occurs in the portion where the circumferential edge of the source wiring crosses the body region, such a breakdown occurs in the second portion which hardly influences the properties of the semiconductor device. Consequently, it is possible to effectively suppress variations in properties caused by the damage to the gate insulating film resulting from the breakdown while effectively avoiding or suppressing the occurrence of the breakdown in the first portion.

The semiconductor device described above may further include a drain wiring which is formed, in plan view when viewed from a normal direction to the front surface of the semiconductor layer, so as to cross the body region and which is electrically connected to the source region. Preferably, in this configuration, the second portion of the body region is formed, in the plan view, in a portion where at least a circumferential edge of the drain wiring crosses the body region.

There is a tendency that in the portion of the semiconductor layer where the circumferential edge of the drain wiring crosses the body region in plan view, the electric field is disturbed or concentrated. Thus, a breakdown is more likely to occur than other portions. Therefore, in this configuration, the second portion is formed in the portion where the circumferential edge of the drain wiring crosses the body region at least in plan view. In this way, even if a breakdown occurs in the portion where the circumferential edge of the drain wiring crosses the body region, such a breakdown occurs in the second portion which hardly influences the properties of the semiconductor device. Consequently, it is possible to effectively suppress variations in properties caused by the damage to the gate insulating film resulting from the breakdown while effectively avoiding or suppressing the occurrence of the breakdown in the first portion.

In the semiconductor device described above, the second portion of the body region may have an impurity concentration different from an impurity concentration of the first portion of the body region.

In the semiconductor device described above, the body region may have an impurity concentration distribution in which an impurity concentration of an intermediate portion in a thickness direction extending from the front surface portion to a bottom portion of the body region is lowest.

In the semiconductor device described above, the body region may include a first high-concentration region formed in the front surface portion, a second high-concentration region formed in a bottom portion and a low-concentration region which is interposed between the first high-concentration region and the second high-concentration region and which has an impurity concentration lower than impurity concentrations of the first high-concentration region and the second high-concentration region.

In the semiconductor device described above, the first portion of the body region may include the first high-concentration region, the second high-concentration region and the low-concentration region. The second portion of the body region may include the low-concentration region drawn from between the first high-concentration region and the second high-concentration region to the front surface portion of the semiconductor layer.

The semiconductor device described above may further include a first conductivity type RESURF layer which is formed in a portion in contact with the thick insulating film in the semiconductor layer and which has an impurity concentration lower than an impurity concentration of the semiconductor layer. In this configuration, the second portion of the body region may be formed so as to be in contact with the RESURF layer.

In this configuration, when a drain-source voltage is applied, a depletion layer is extended from the boundary between the RESURF layer and the semiconductor layer, and thus it is possible to rapidly deplete the entire front surface portion of the semiconductor layer where the RESURF layer is formed. In this way, the electric field in the semiconductor layer can be relaxed. Consequently, it is possible to suppress, with the second portion, the occurrence of the breakdown in the entire semiconductor device while effectively avoiding or suppressing the occurrence of the breakdown in the first portion.

In the semiconductor device described above, the first portion of the body region may be formed so as to be opposite to the RESURF layer across part of the semiconductor layer.

A preferred embodiment of the present invention provides a gate driver including a low-side circuit which is formed in a low-side region on a semiconductor substrate, a high-side circuit which is formed in a high-side region separated from the low-side region on the semiconductor substrate and which has an operation voltage higher than an operation voltage of the low-side circuit, and a level shift circuit which is formed on the semiconductor substrate and which is connected to the high-side circuit. The level shift circuit includes the semiconductor device having the features described above.

Preferably, the level shift circuit is arranged outside the high-side region.

The gate driver described above may further include a separation region which is formed on the semiconductor substrate and which separates the low-side region and the high-side region. In this case, at least a portion of the level shift circuit may be arranged outside the separation region. The level shift circuit may be arranged in the separation region.

Preferred embodiments of the present invention will be described in detail below with reference to accompanying drawings.

First Preferred Embodiment

Figure 2:
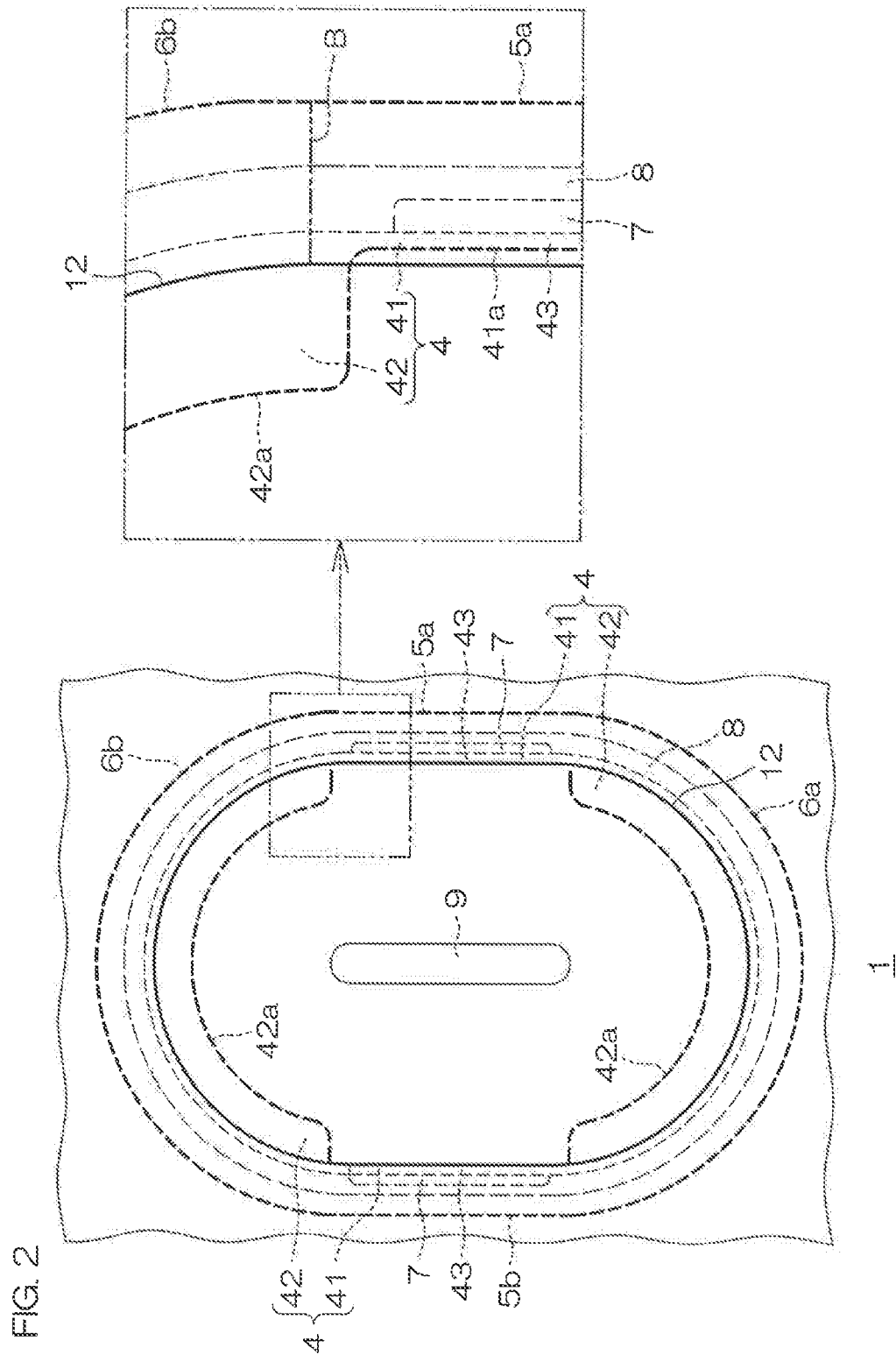
FIG. 2 is a plan view of the semiconductor device shown in FIG. 1 and shows an internal structure while the illustration of a configuration on a LOCOS film is omitted.
Figure 3:
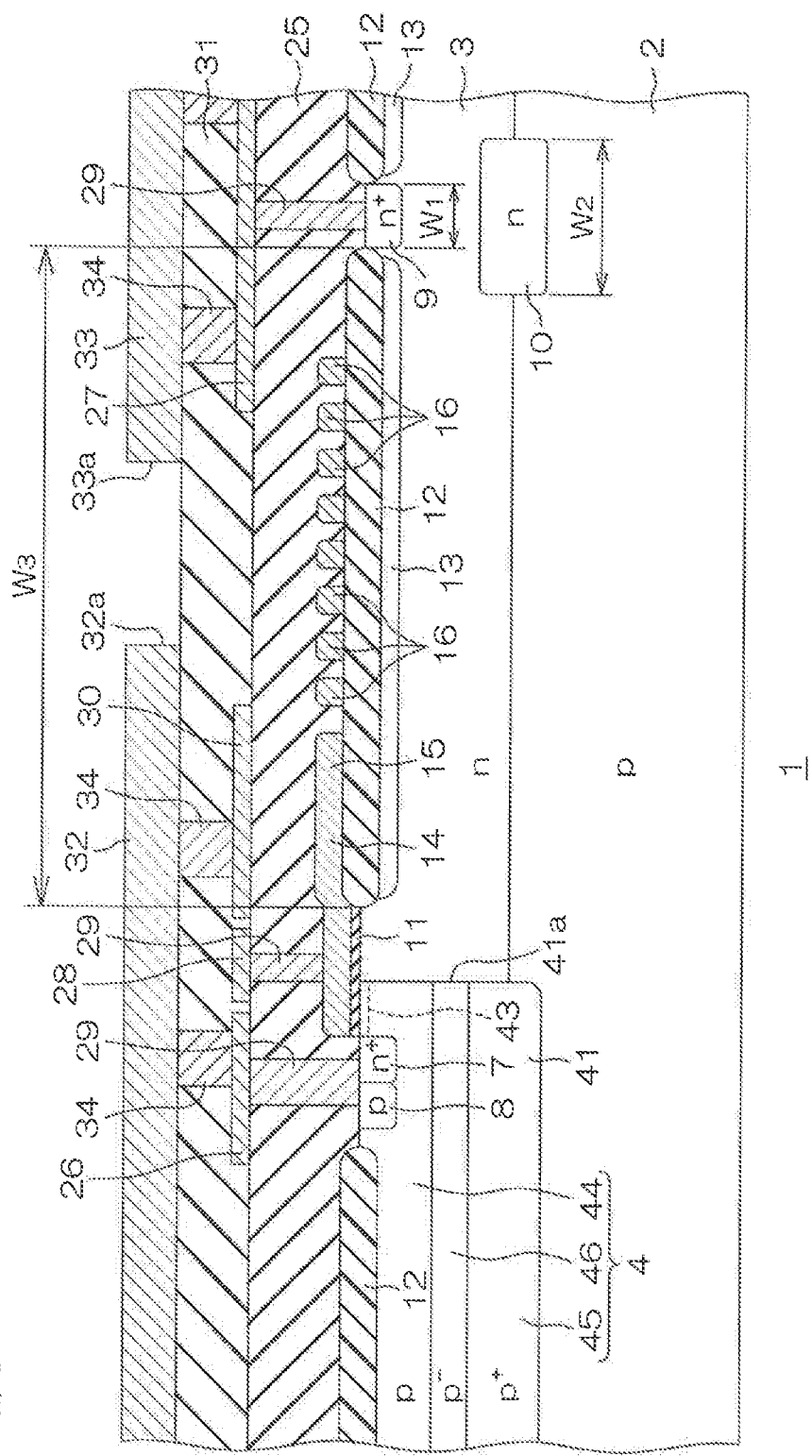
FIG. 3 is a cross-sectional view taken along line III-III shown in FIG. 1.
Figure 4:
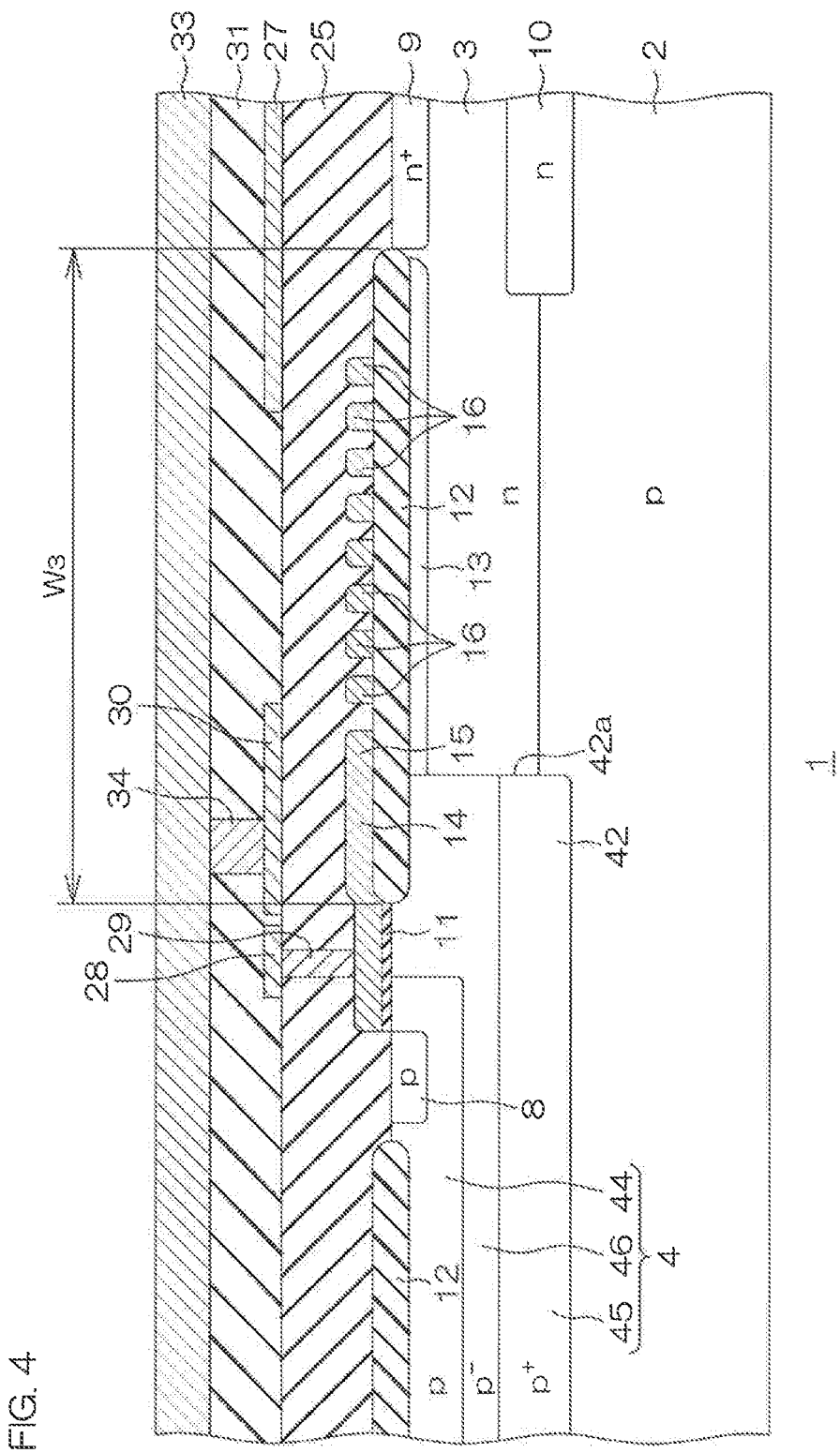
FIG. 4 is a cross-sectional view taken along line IV-IV shown in FIG. 1.

FIG. 1 is a plan view of a semiconductor device 1 according to a first preferred embodiment of the present invention. FIG. 2 is a plan view of the semiconductor device 1 shown in FIG. 1 and shows an internal structure while the illustration of a configuration on a LOCOS film 12 is omitted. FIG. 3 is a cross-sectional view taken along line III-III shown in FIG. 1. FIG. 4 is a cross-sectional view taken along line IV-IV shown in FIG. 1. In FIG. 1, for clarification, wirings 32 and 33 which will be described later are shown by being hatched.

The semiconductor device 1 is, for example, a semiconductor device that includes an LDMIS (Laterally Diffused Metal Insulator Semiconductor) region in which a drain-source voltage $V_{DS}$ is about 500 V to 1500 V. The semiconductor device 1 includes a p-type (first conductivity type) semiconductor substrate 2 and an epitaxial layer 3 which is formed on the semiconductor substrate 2 so as to be in contact with the semiconductor substrate 2 and which is an example of an n-type (second conductivity type) semiconductor layer. The semiconductor substrate 2 is formed of, for example, silicon, and is a high-resistance substrate which has a relatively low impurity concentration. The impurity concentration of the semiconductor substrate 2 is, for example, $1.0 \times 10^{13}$ cm$^{-3}$ to $1.0 \times 10^{14}$ cm$^{-3}$, and the impurity concentration of the epitaxial layer 3 is, for example, $1.0 \times 10^{15}$ cm$^{-3}$ to $1.0 \times 10^{16}$ cm$^{-3}$. The epitaxial layer 3 has a thickness of, for example, 5 μm to 10 μm. In a front surface portion of the epitaxial layer 3, a p-type body region 4 is formed.

The body region 4 is formed substantially in the shape of a ring in plan view viewed from a normal direction to the front surface of the epitaxial layer 3 (hereinafter simply referred to as "plan view"). In the present preferred embodiment, the body region 4 is formed, in plan view, substantially in the shape of an oval ring which has a pair of strip-shaped straight parts 5a and 5b parallel to each other and a pair of strip-shaped curved parts 6a and 6b respectively continuous to both ends of the pair of straight parts 5a and 5b. The specific configuration of the body region 4 will be described later. In the front surface portion of the body region 4, an n-type source region 7 and a p-type body contact region 8 are formed adjacent to each other.

The source region 7 is formed apart from the inner circumferential edge of the body region 4. In the present preferred embodiment, a plurality of source regions 7 are formed in the front surface portion of the body region 4. More specifically, the plurality of source regions 7 are each formed in a strip shape in the pair of straight parts 5a and 5b in the body region 4. On the other hand, the body contact region 8 is formed in the shape of a ring along the body region 4. The body contact region 8 has an impurity concentration higher than that of the body region 4. In the center portion of a region surrounded by the body region 4 in the front surface portion of the epitaxial layer 3, an n-type drain region 9 is formed apart from the body region 4.

In an intermediate portion in a direction opposite to the pair of straight parts 5a and 5b in the body region 4, the drain region 9 is formed in a strip shape substantially parallel to the straight parts 5a and 5b. The drain region 9 has an impurity concentration substantially equal to that of the source region 7. With reference to FIGS. 3 and 4, in a region immediately below the drain region 9, an n-type drain buffer region 10 is formed.

The drain buffer region 10 is formed so as to cross a boundary between the semiconductor substrate 2 and the epitaxial layer 3, and forms a p-n junction between the drain buffer region 10 and the semiconductor substrate 2. The drain buffer region 10 is formed in a strip shape along the drain region 9, and is opposite to the bottom portion of the drain region 9 across part of the epitaxial layer 3. The drain buffer region 10 has, in the direction opposite to the pair of straight parts 5a and 5b, a width $W_2$ wider than the width $W_1$ of the drain region 9. The drain buffer region 10 has an impurity concentration higher than that of the epitaxial layer 3 but lower than that of the drain region 9. The impurity concentration of the drain buffer region 10 is, for example, $1.0 \times 10^{15}$ cm$^{-3}$ to $1.0 \times 10^{16}$ cm$^{-3}$.

In the front surface of the epitaxial layer 3, a gate insulating film 11 and a LOCOS (Local Oxidation of Silicon) film 12 which is an example of a thick insulating film are formed integrally. The gate insulating film 11 is formed in the shape of a ring so as to be in contact with the body region 4 between the drain region 9 and the source region 7. More specifically, the gate insulating film 11 is formed so as to cross the inner circumferential edge of the body region 4 from the circumferential edge of the source region 7 on the side of the drain region 9 and the circumferential edge of the body contact region 8 on the side of the drain region 9. The gate insulating film 11 may be, for example, a nitride film (SiN film), a silicon oxide film (SiO$_2$ film) or a multilayer film of a nitride film and a silicon oxide film. In the present preferred embodiment, the gate insulating film 11 is a silicon oxide film (gate oxide film).

The LOCOS film 12 is formed, in plan view, in the shape of a ring so as to cover the epitaxial layer 3 between the gate insulating film 11 and the drain region 9. The inner circumferential edge of the LOCOS film 12 surrounds the drain region 9. The outer circumferential edge of the LOCOS film 12 is formed in a position apart from the inner circumferential edge of the body region 4 toward the side of the drain region 9. The width $W_3$ of the LOCOS film 12 from the inner circumferential edge to the outer circumferential edge is, for example, 80 μm to 200 μm (in the present preferred embodiment, 120 μm).

With reference to FIGS. 3 and 4, the LOCOS film 12 has a thickness greater than that of the gate insulating film 11. The LOCOS film 12 has a thickness of, for example, 5000 Å to 15000 Å (in the present preferred embodiment, 8000 Å), and the gate insulating film 11 has a thickness of, for example, 300 Å to 1000 Å (in the present preferred embodiment, 500 Å).

In a portion of the epitaxial layer 3 in contact with the LOCOS film 12, a p-type RESURF layer 13 is formed. The RESURF layer 13 is formed in the shape of a ring along the LOCOS film 12, and forms a p-n junction between the RESURF layer 13 and the epitaxial layer 3. The RESURF layer 13 has an impurity concentration lower than that of the epitaxial layer 3. The impurity concentration of the RESURF layer 13 is, for example, $1.0 \times 10^{15}$ cm$^{-3}$ to $1.0 \times 10^{16}$ cm$^{-3}$.

On the gate insulating film 11, a gate electrode 14 is formed. The gate electrode 14 is formed between the source region 7 and the drain region 9 via the gate insulating film 11 so as to be opposite to the body region 4. The gate electrode 14 has a covering portion 15 that is continuously extended from the top of the gate insulating film 11 to the top of the outer circumferential edge of the LOCOS film 12 and that covers the outer circumferential edge of the LOCOS film 12. The gate electrode 14 may be formed of, for example, polysilicon to which an impurity is doped.

On the LOCOS film. 12, a plurality of (in the present preferred embodiment, eight) field plates 16 are formed apart from each other. The field plates 16 suppress the disturbance of an electric field in the epitaxial layer 3. The plurality of field plates 16 are formed in the shape of rings whose circumferential lengths are different from each other and which are similar. More specifically, the field plates 16 are arranged apart from each other such that field plates 16 having relatively long circumferential lengths surround field plates 16 having relatively short circumferential lengths. The plurality of field plates 16 are formed of the same material as that of the gate electrode 14. The field plate 16 located in the outermost circumference may be formed integrally with the covering portion 15 of the gate electrode 14. It suffices that at least one or more field plates 16 are provided, and eight or more field plates 16 may be provided.

On the epitaxial layer 3, a first interlayer insulating film 25 is formed so as to cover the LOCOS film 12, the gate electrode 14 and the field plates 16. The first interlayer insulating film 25 includes an insulator such as silicon oxide or silicon nitride. On the first interlayer insulating film 25, a source metal 26, a drain metal 27 and a gate metal 28 are formed.

Contacts 29 respectively corresponding to the source metal 26, the drain metal 27 and the gate metal 28 penetrate the first interlayer insulating film 25. The source metal 26 is electrically connected via the corresponding contact 29 to the source region 7 and the body contact region 8. The source metal 26 is provided in a strip shape so as to cover at least part or all of the source region 7. The drain metal 27 is electrically connected via the corresponding contact 29 to the drain region 9. The drain metal 27 is provided in a strip shape so as to cover at least part or all of the drain region 9. The gate metal 28 is electrically connected via the corresponding contact 29 to the gate electrode 14. The gate metal 28 is provided in the shape of a ring so as to cover at least part or all of the gate electrode 14.

On the first interlayer insulating film 25, a field metal 30 for suppressing, for example, the disturbance of the electric field in the epitaxial layer 3 is further formed. In the present preferred embodiment, the field metal 30 is provided in the shape of a ring along the inner circumference of the gate metal 28. On the first interlayer insulating film 25, a second interlayer insulating film 31 is formed so as to cover the source metal 26, the drain metal 27, the gate metal 28 and the field metal 30. The second interlayer insulating film 31 includes an insulator such as silicon oxide or silicon nitride, for example. On the second interlayer insulating film 31, a source wiring 32 and a drain wiring 33 are formed.

A plurality of contacts 34 penetrate the second interlayer insulating film 31. The source wiring 32 is electrically connected via the corresponding contact 34 to the source metal 26 and the field metal 30. As shown in FIG. 1, the source wiring 32 is formed, in plan view, to have an indentation such that at least part of the second interlayer insulating film 31 on the drain region 9 is exposed. More specifically, the source wiring 32 is formed so as to cross the curved part 6a on one side of the body region 4 and to cover the region on the pair of straight parts 5a and 5b and the region on the other side of the curved part 6b.

The drain wiring 33 is electrically connected via the corresponding contact 34 to the drain metal 27. As shown in FIG. 1, the drain wiring 33 is formed, in plan view, in a protrusion shape such that it enters the indentation of the source wiring 32 when the second interlayer insulating film 31 is exposed from the source wiring 32. More specifically, the drain wiring 33 is formed so as to cross the curved part 6a on one side of the body region 4 and to cover the portion on the drain region 9.

The configuration of the body region 4 will be more specifically described while referring back to FIGS. 1 to 4. The body region 4 includes a first body portion 41 (first portion) in which a boundary 41a with the epitaxial layer 3 is in contact with the gate insulating film 11 and a second body portion 42 (second portion) in which a boundary 42a with the epitaxial layer 3 is in contact with the LOCOS film 12. Specifically, the boundaries 41a and 42a with the epitaxial layer 3 are p-n junction portions which are formed between the body region 4 and the epitaxial layer 3. In the following description, the boundaries 41a and 42a of the first body portion 41 and the second body portion 42 are referred to as the p-n junction portions 41a and 42a, respectively.

As shown in FIGS. 1 and 3, the first body portion 41 of the body region 4 is formed in a portion along the pair of straight parts 5a and 5b. In the first body portion 41, a portion opposite to the gate electrode 14 via the gate insulating film 11 is a channel region in which when an appropriate voltage is applied to the gate electrode 14, a channel 43 is formed. The first body portion 41 forms a current path between the first body portion 41 and the epitaxial layer 3 by the formation of the channel 43.

As shown in FIG. 1, the second body portion 42 of the body region 4 is an extension portion that is formed so as to be extended to the side of the drain region 9 as compared with the first body portion 41. The second body portion 42 is formed in the shape of a strip along the pair of curved parts 6a and 6b. As shown in FIG. 4, the second body portion 42 is opposite to the covering portion 15 of the gate electrode 14 across the LOCOS film 12. The p-n junction portion 42a of the second body portion 42 is located between the gate insulating film 11 and an end portion of the gate electrode 14 on the side of the drain region 9. In the present preferred embodiment, since the second body portion 42 is formed outside a region between the source region 7 and the drain region 9, the second body portion 42 does not form a current path between the second body portion 42 and the epitaxial layer 3.

With reference to FIGS. 3 and 4, the body region 4 has an impurity concentration distribution in which the impurity concentration of an intermediate portion in a thickness direction extending from the front surface portion to the bottom portion of the body region 4 is lowest. More specifically, the body region 4 includes a p-type first high-concentration region 44 which is formed in the front surface portion and a p$^+$-type second high-concentration region 45 which is formed in the bottom portion and which has an impurity concentration higher than that of the first high-concentration region 44. Furthermore, the body region 4 includes a p$^-$-type low-concentration region 46 which is interposed between the first high-concentration region 44 and the second high-concentration region 45 and which has an impurity concentration lower than that of the first high-concentration region 44. The impurity concentration of the first high-concentration region 44 is, for example, $1.0 \times 10^{17}$ cm$^{-3}$ to $1.0 \times 10^{18}$ cm$^{-3}$. The impurity concentration of the second high-concentration region 45 is, for example, $1.0 \times 10^{18}$ cm$^{-3}$ to $1.0 \times 10^{19}$ cm$^{-3}$. The impurity concentration of the low-concentration region 46 is, for example, $1.0 \times 10^{16}$ cm$^{-3}$ to $1.0 \times 10^{17}$ cm$^{-3}$.

The first high-concentration region 44 and the low-concentration region 46 are provided so as to form p-n junction portions between the first high-concentration region 44 and the low-concentration region 46 and the epitaxial layer 3. On the other hand, the second high-concentration region 45 is formed so as to cross the boundary between the semiconductor substrate 2 and the epitaxial layer 3 in a thickness direction of the body region 4, and is provided so as to form a p-n junction portion between the second high-concentration region 45 and part of the epitaxial layer 3. In the body region 4, the second body portion 42 is formed so as to have an impurity concentration different from that of the first body portion 41.

More specifically, with reference to FIG. 3, the first body portion 41 includes the first high-concentration region 44, the second high-concentration region 45 and the low-concentration region 46. In the first body portion 41, the p-n junction portion 41a is formed between the first high-concentration region 44, the second high-concentration region 45 and the low-concentration region 46 and the epitaxial layer 3. The first high-concentration region 44 of the first body portion 41 is opposite to the RESURF layer 13 across part of the epitaxial layer 3.

On the other hand, with reference to FIG. 4, the second body portion 42 includes the second high-concentration region 45 and the low-concentration region 46. In the second body portion 42, the p-n junction portion 42a is formed between the second high-concentration region 45 and the low-concentration region 46 and the epitaxial layer 3. The low-concentration region 46 of the second body portion 42 is drawn from between the first high-concentration region 44 and the second high-concentration region 45 to the front surface portion of the epitaxial layer 3 on the side of the drain region 9. The low-concentration region 46 of the second body portion 42 is in contact with the RESURF layer 13. The second high-concentration region 45 of the second body portion 42 is drawn to the side of the drain region 9 with its depth maintained so as to be in contact with the bottom portion of the low-concentration region 46.

With reference to FIG. 1, the second body portion 42 is formed, in plan view, in a region where at least the circumferential edge 32a of the source wiring 32 crosses the body region 4. Furthermore, the second body portion 42 is formed, in plan view, in a region where at least the circumferential edge 33a of the drain wiring 33 crosses the body region 4. With reference to the enlarged view of FIG. 2, the second body portion 42 is formed, in plan view, so as to straddle at least the boundary B between the straight parts 5a and 5b and the curved parts 6a and 6b in the body region 4.

As described above, in the present preferred embodiment, the first body portion 41 forms the channel 43 to form the current path between the first body portion 41 and the epitaxial layer 3. On the other hand, the second body portion 42 is formed outside the region between the source region 7 and the drain region 9 in the body region 4. Therefore, since in the second body portion 42, the channel 43 is not formed, the second body portion 42 does not form a current path between the second body portion 42 and the epitaxial layer 3. In other words, the second body portion 42 hardly contributes to the properties of the semiconductor device 1 such as the threshold voltage and the leakage current.

In the epitaxial layer 3, an electric potential gradient is produced from the source region 7 toward the drain region 9, and an electric field greater than an electric field applied to the p-n junction portion 41a of the first body portion 41 is applied to the p-n junction portion 42a of the second body portion 42 which is relatively closer to the drain region 9. In other words, the electric field strength applied to the p-n junction portion 41a of the first body portion 41 is relatively reduced due to the second body portion 42.

Therefore, when a high voltage such as a surge voltage is applied between the drain region 9 and the source region 7, since its load is concentrated in the second body portion 42, it is possible to preferentially break down the second body portion 42 as compared with the first body portion 41. In this way, a high electric field, hot carriers and the like caused by the breakdown can be concentrated in the second body portion 42. Moreover, since the second body portion 42 is formed apart from the first body portion 41, the location of the body region 4 where the breakdown occurs can be separated away from the first body portion 41. Consequently, since it is possible to effectively avoid or suppress the breakdown in the first body portion 41, it is possible to effectively suppress the damage to the gate insulating film 11 in contact with the first body portion 41.

On the other hand, since in the second body portion 42, the p-n junction portion 42a is in contact with the LOCOS film 12, it is possible to suppress the concentration of the load in the gate insulating film 11 in contact with the second body portion 42. In this way, it is also possible to suppress the damage to the gate insulating film 11 in contact with the second body portion 42. Consequently, it is possible to provide the semiconductor device 1 that suppress variations in properties caused by the damage to the gate insulating film 11 resulting from the breakdown and that can thereby enhance the reliability.

In the present preferred embodiment, a plurality of second body portions 42 are formed. In this configuration, since break-down can occur at the plurality of second body portions 42, the load resulting from the breakdown can be dispersed in the plurality of second body portions 42. In this way, it is possible to reduce the load per second body portion 42, and thus it is possible to effectively suppress variations in properties caused by the damage to the gate insulating film 11 resulting from the breakdown while effectively avoiding or suppressing the occurrence of the breakdown in the first body portion 41.

In the body region 4, there is a tendency that in the portion straddling the boundary B between the straight parts 5a and 5b and the curved parts 6a and 6b, the electric field is disturbed or concentrated. Thus, a breakdown is more likely to occur than other portions. Therefore, in the present preferred embodiment, the second body portion 42 is formed so as to straddle at least the boundary B between the straight parts 5a and 5b and the curved parts 6a and 6b. In this way, even if a breakdown occurs in the portion straddling the boundary B between the straight parts 5a and 5b and the curved parts 6a and 6b, such a breakdown occurs in the second body portion 42 which hardly influences the properties of the semiconductor device 1. As described above, the second body portion 42 is provided in the portion where a breakdown easily occurs, and thus it is possible to effectively suppress variations in properties caused by the damage to the gate insulating film 11 resulting from the breakdown while effectively suppressing the occurrence of the breakdown in the first body portion 41.

In the present preferred embodiment, since the p-n junction portion 42a of the second body portion 42 is located between the gate insulating film 11 and the end portion of the gate electrode 14 on the side of the drain region 9, it is possible to increase the electric field strength in the p-n junction portion 42a of the second body portion 42. In this way, it is possible to relatively further reduce the electric field strength in the first body portion 41. Consequently, it is possible to effectively suppress variations in properties caused by the damage to the gate insulating film 11 resulting from the breakdown while effectively avoiding or suppressing the occurrence of the breakdown in the first body portion 41.

In a portion of the epitaxial layer 3 in which the circumferential edge 32a of the source wiring 32 and the circumferential edge 33a of the drain wiring 33 cross the body region 4 in plan view, there is a tendency that the electric field is disturbed or concentrated. Thus, a breakdown is more likely to occur than other portions. Therefore, in the present preferred embodiment, the second body portion 42 is formed in at least the portion in which the circumferential edge 32a of the source wiring 32 and the circumferential edge 33a of the drain wiring 33 cross the body region 4 in plan view. In this way, even if a breakdown occurs in the portion in which the circumferential edge 32a of the source wiring 32 and the circumferential edge 33a of the drain wiring 33 cross the body region 4, such a breakdown occurs in the second body portion 42 which hardly influences the properties of the semiconductor device 1. In this way, it is possible to effectively suppress variations in the properties of the semiconductor device 1 caused by the breakdown while suppressing the occurrence of the breakdown in other portions.

In addition, in the present preferred embodiment, the RESURF layer 13 is formed in the front surface portion of the epitaxial layer 3. When the predetermined drain-source voltage $V_{DS}$ is applied, a depletion layer is extended from a p-n junction portion formed between the RESURF layer 13 and the epitaxial layer 3, and thus it is possible to rapidly deplete the entire front surface portion of the epitaxial layer 3 where the RESURF layer 13 is formed. In this way, since the electric field in the epitaxial layer 3 can be relaxed, it is possible to suppress, with the second body portion 42, the occurrence of the breakdown in the entire semiconductor device 1 while effectively avoiding or suppressing the occurrence of the breakdown in the first body portion 41.

Second Preferred Embodiment

Figure 5:
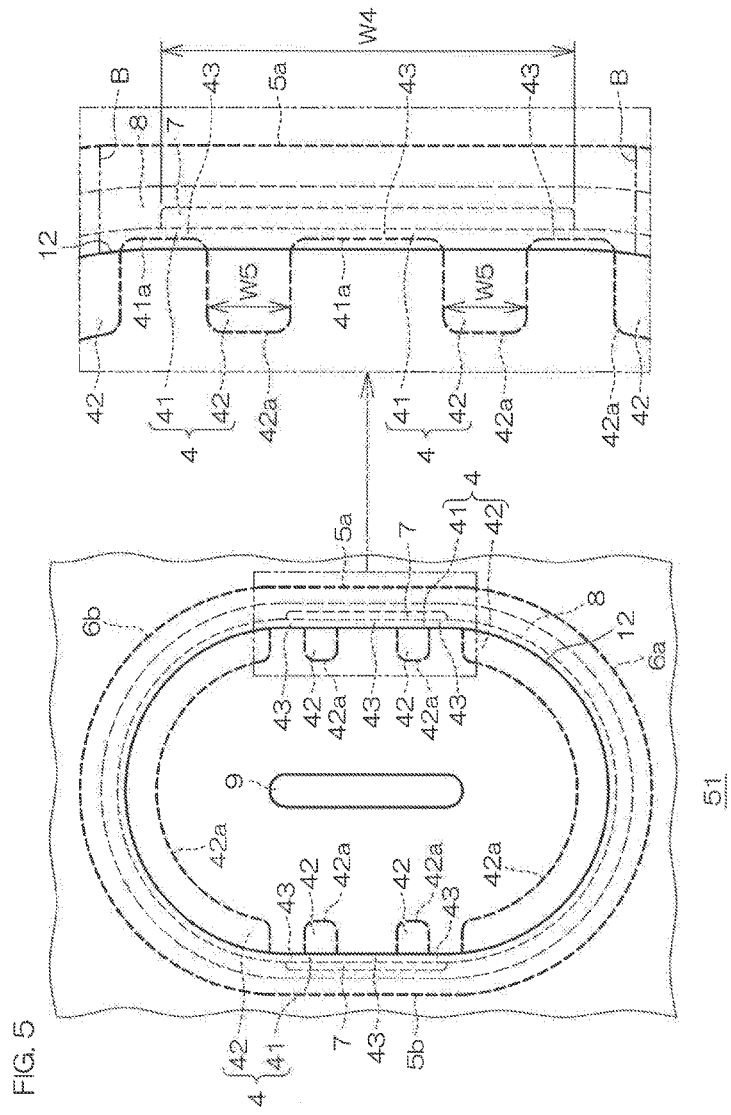
FIG. 5 is a plan view of a semiconductor device according to a second preferred embodiment of the present invention and shows an internal structure while the illustration of a configuration on a LOCOS film is omitted.

FIG. 5 is a plan view of a semiconductor device 51 according to a second preferred embodiment of the present invention and shows an internal structure while the illustration of a configuration on the LOCOS film 12 is omitted. In FIG. 5, the configurations corresponding to the respective portions shown in FIG. 2 and the like described above are identified with the same reference symbols, and their description will be omitted.

The semiconductor device 51 further includes the second body portions 42 formed in the pair of straight parts 5a and 5b in the body region 4. More specifically, the semiconductor device 51 includes a plurality of first body portions 41 and a plurality of second body portions 42 formed in a rectangular shape in plan view which are alternately formed in the region between the source region 7 and the drain region 9 in the body region 4.

The second body portion 42 is formed, in plan view, so as to have a width $W_5$ narrower than the width $W_4$ of the source region 7 in the direction along the straight parts 5a and 5b. In the second body portion 42 formed in the straight parts 5a and 5b, although the channel 43 is formed in the region opposite to the gate electrode 14 via the gate insulating film 11, almost no channels 43 are formed in the region opposite to the gate electrode 14 (the covering portion 15) via the LOCOS film 12. Therefore, in the straight parts 5a and 5b, the second body portion 42 does not form a current path between the second body portion 42 and the epitaxial layer 3.

As described above, even in the present preferred embodiment, the same effects as described in the first preferred embodiment can be achieved. In the present preferred embodiment, in the region between the source region 7 and the drain region 9 in the body region 4, a plurality of first body portions 41 and a plurality of second body portions 42 are formed. In this configuration, it is possible to effectively reduce a risk of occurrence of a breakdown in the first body portion 41 in the region between the source region 7 and the drain region 9 opposite to each other. Since in the straight parts 5a and 5b, breakdowns can occur in a plurality of second body portions 42, the load resulting from the breakdowns can be dispersed in the plurality of second body portions 42. In this way, it is possible to reduce the load per second body portion 42, and thus it is possible to effectively suppress, for example, the damage to the gate insulating film 11 resulting from the breakdown.

Third Preferred Embodiment

Figure 6:
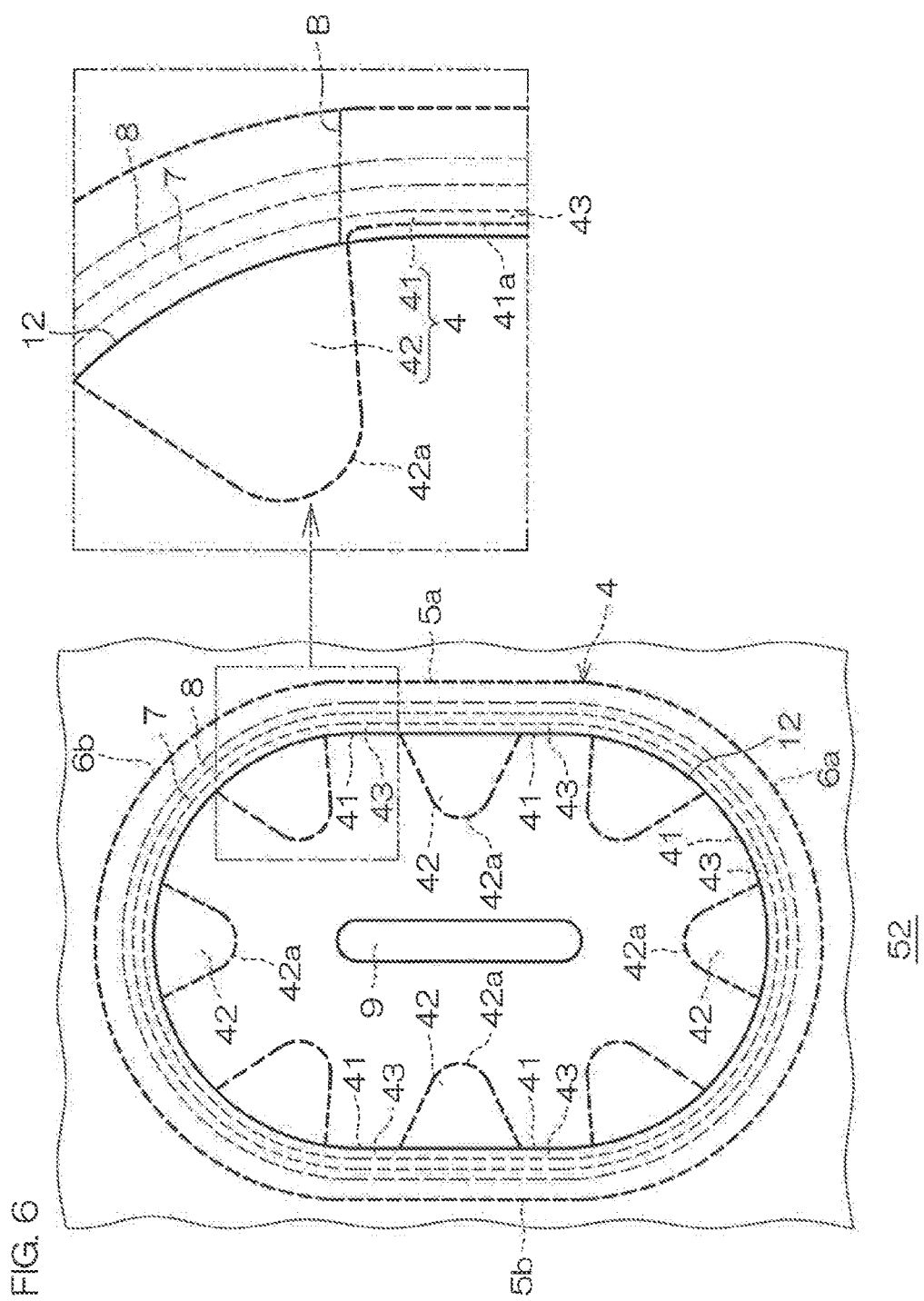
FIG. 6 is a plan view of a semiconductor device according to a third preferred embodiment of the present invention and shows an internal structure while the illustration of a configuration on a LOCOS film is omitted.

FIG. 6 is a plan view of a semiconductor device 52 according to a third preferred embodiment of the present invention and shows an internal structure while the illustration of a configuration on the LOCOS film 12 is omitted. In FIG. 5, the configurations corresponding to the respective portions shown in FIG. 2 and the like described above are identified with the same reference symbols, and their description will be omitted.

The semiconductor device 52 includes the body region 4 and the source region 7 which are formed in the shape of a ring in plan view. The body region 4 includes a plurality of (in the present preferred embodiment, eight) first body portions 41 arranged along the ring shape and a plurality of (in the present preferred embodiment, eight) second body portions 42. The first body portions 41 and the second body portions 42 are formed at regular intervals. The plurality of first body portions 41 are formed, in plan view, so as to have the same width. The first body portion 41 forms a current path between the first body portion 41 and the epitaxial layer 3 by the formation of the channel 43.

The plurality of second body portions 42 are formed, in plan view, substantially in the shape of a triangle so as to have the same width (size). In the second body portion 42, although the channel 43 is formed in the region opposite to the gate electrode 14 via the gate insulating film 11, almost no channels 43 are formed in the region opposite to the gate electrode 14 (the covering portion 15) via the LOCOS film 12. Therefore, the second body portion 42 does not form a current path between the second body portion 42 and the epitaxial layer 3. It suffices that at least one or more second body portions 42 are formed, and there is no limitation on the number of second body portions 42 described above.

Even in the configuration described above, the same effects as described in the respective preferred embodiments described above can be achieved.

Still Other Preferred Embodiments

Although the preferred embodiments of the present invention are described above, the present invention can also be practiced with still other preferred embodiments.

Figure 7:
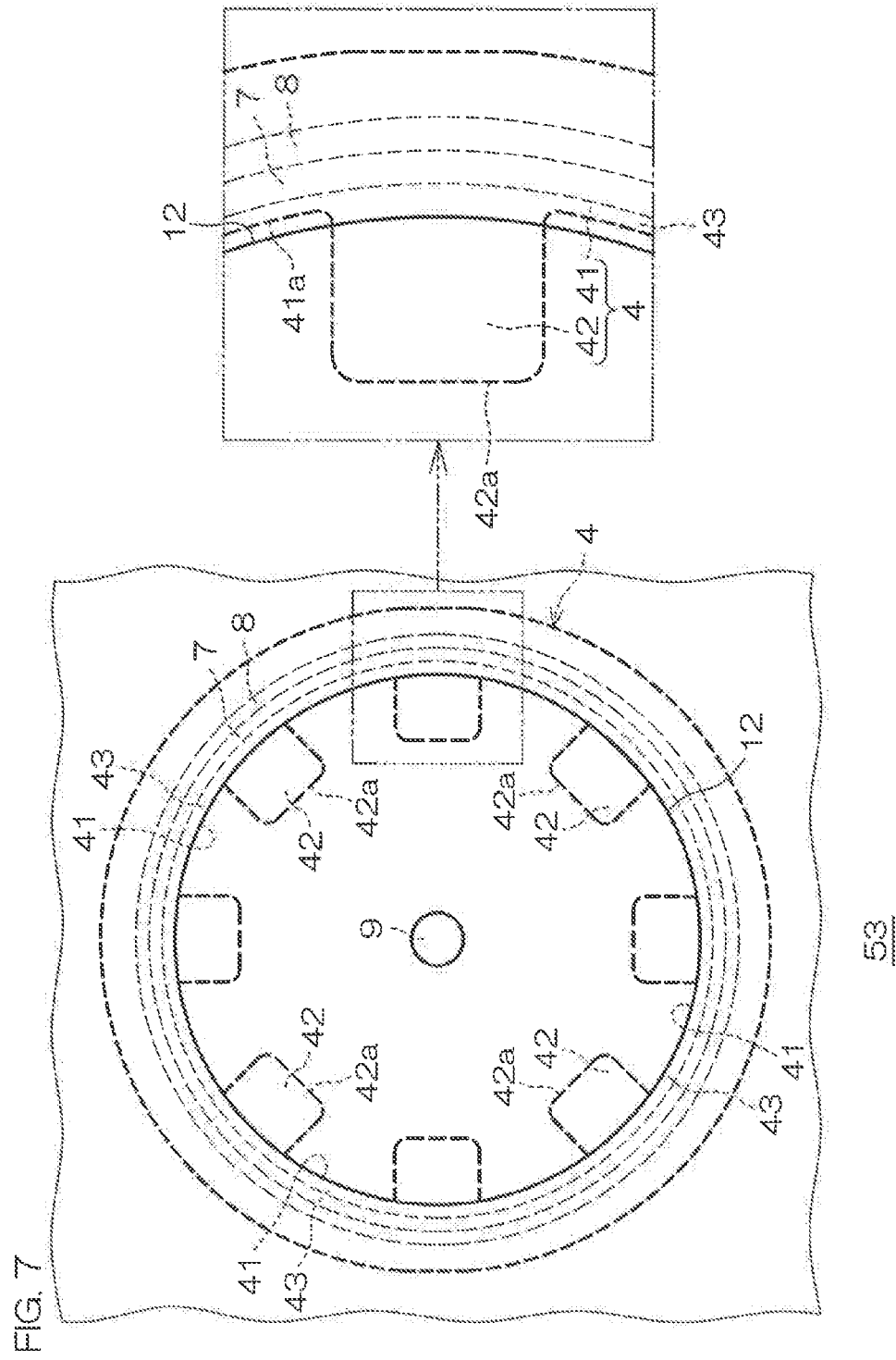
FIG. 7 is a plan view of a semiconductor device according to a modification and shows an internal structure while the illustration of a configuration on a LOCOS film is omitted.

For example, in the respective preferred embodiments described above, the examples where the semiconductor devices 1, 51 and 52 include the body region 4 which is formed, in plan view, substantially in the shape of an oval ring having the straight parts 5a and 5b and the curved parts 6a and 6b are described. However, the semiconductor devices 1, 51 and 52 may include the body region 4 which is formed substantially in the shape of a circular ring. As an example where the body region 4 formed substantially in the shape of a circular ring is included, a semiconductor device 53 shown in FIG. 7 may be adopted. In FIG. 7, as a modification of the semiconductor device 52 described above, the semiconductor device 53 is shown. In the body region 4 formed substantially in the shape of a circular ring, the configurations of the source region 7, the body contact region 8, the drain region 9, the LOCOS film 12 and the like also correspond in shape to the body region 4 formed substantially in the shape of a circular ring.

Figure 8:
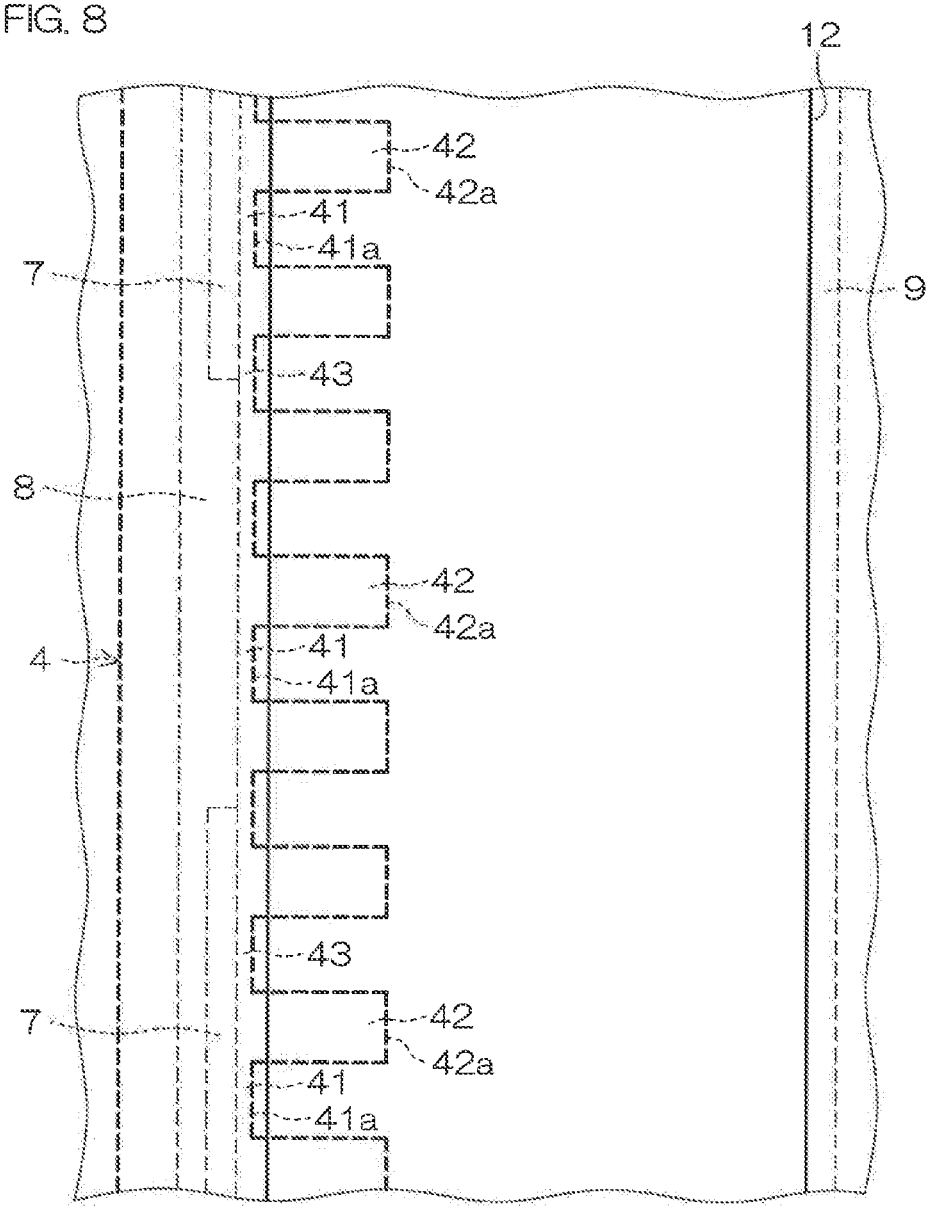
FIG. 8 is a plan view of a semiconductor device according to another modification and shows an internal structure while the illustration of a configuration on a LOCOS film is omitted.

The semiconductor devices 1, 51 and 52 may include a body region 4 formed in a strip shape having an end instead of the body region 4 formed substantially in the shape of an oval ring (endless shape). As an example where the body region 4 formed in a strip shape having an end is included, a semiconductor device 54 shown in FIG. 8 may be adopted. In FIG. 8, as a modification of the semiconductor device 51 described above, the semiconductor device 54 is shown. In the body region 4 formed in a strip shape having an end, the configurations of the source region 7, the body contact region 8, the drain region 9, the LOCOS film 12 and the like also correspond in shape to the body region 4 formed in a strip shape having an end.

In the respective preferred embodiments described above, the examples where the semiconductor devices 1, 51 and 52 include the LOCOS film 12 serving as an example of the thick insulating film are described. The semiconductor devices 1, 51 and 52 may include STI (Shallow Trench Insulation) instead of the LOCOS film 12. When the thick insulating film is the STI, the semiconductor devices 1, 51 and 52 include a trench which is formed by digging the epitaxial layer 3 between the gate insulating film 11 and the drain region 9 and which is formed in the shape of a ring in plan view and an insulator which is embedded in the trench. The insulator may be formed on the epitaxial layer 3 integrally with the gate insulating film 11. As the insulator, silicon oxide, silicon nitride and the like can be illustrated. An insulating film formed by element separation technique is appropriate as the "thick insulating film."

In the respective preferred embodiments described above, the examples where the second body portion 42 includes the second high-concentration region 45 and the low-concentration region 46 are described (see FIG. 4). However, the second body portion 42 may further include the first high-concentration region 44. By forming the body region 4 so as to have a uniform impurity concentration, the first body portion 41 and the second body portion 42 may have the same uniform impurity concentration. The first body portion 41 and the second body portion 42 may have different uniform impurity concentrations to each other. In this case, the second body portion 42 may have an impurity concentration lower than that of the first body portion 41.

In the respective preferred embodiments described above, the examples where the semiconductor devices 1, 51 and 52 include one body region 4 which is continuously formed in the shape of a ring in plan view are described. However, the semiconductor devices 1, 51 and 52 may include a body region 4 which is intermittently formed by being divided into a plurality of portions. In this case, the body region 4 may be intermittently formed by being divided into a plurality of portions in a strip-shaped region along the outer circumferential edge of the LOCOS film 12.

Although in the respective description of the preferred embodiments described above, the conductivity type of the semiconductor substrate 2 is p-type, the conductivity type of the semiconductor substrate 2 may be reversed so as to be n-type. In this case, the conductivity type of other regions is preferably reversed according to the change of the conductivity type of the semiconductor substrate 2.

In the respective preferred embodiments described above, the configuration in which the semiconductor devices 1, 51 and 52 include one LDMIS region having one body region 4 formed in the shape of a ring in plan view is described. However, the semiconductor devices 1, 51 and 52 may include a plurality of LDMIS regions formed apart from each other by having a plurality of body regions 4 which are formed apart from each other and which are formed in the shape of a ring in plan view.

In the respective preferred embodiments described above, the semiconductor devices 1, 51 and 52 may include, in addition to the LDMIS region, various types of semiconductor element regions and/or passive element regions such as a CMIS (Complementary MIS) region, a BJT (Bipolar Junction Transistor) region, a JFET (Junction Field Effect Transistor) region, a capacitor region and a resistor region. Furthermore, the semiconductor devices 1, 51 and 52 may form integrated circuits such as LSI (Large Scale Integration), SSI (Small Scale Integration), MSI (Medium Scale Integration), VLSI (Very Large Scale Integration) and ULSI (Ultra-Very Large Scale Integration) by the combination of the LDMIS region and the semiconductor element regions and/or passive element regions.

One specific example of the semiconductor device having the LDMIS region will be described below.

Figure 9:
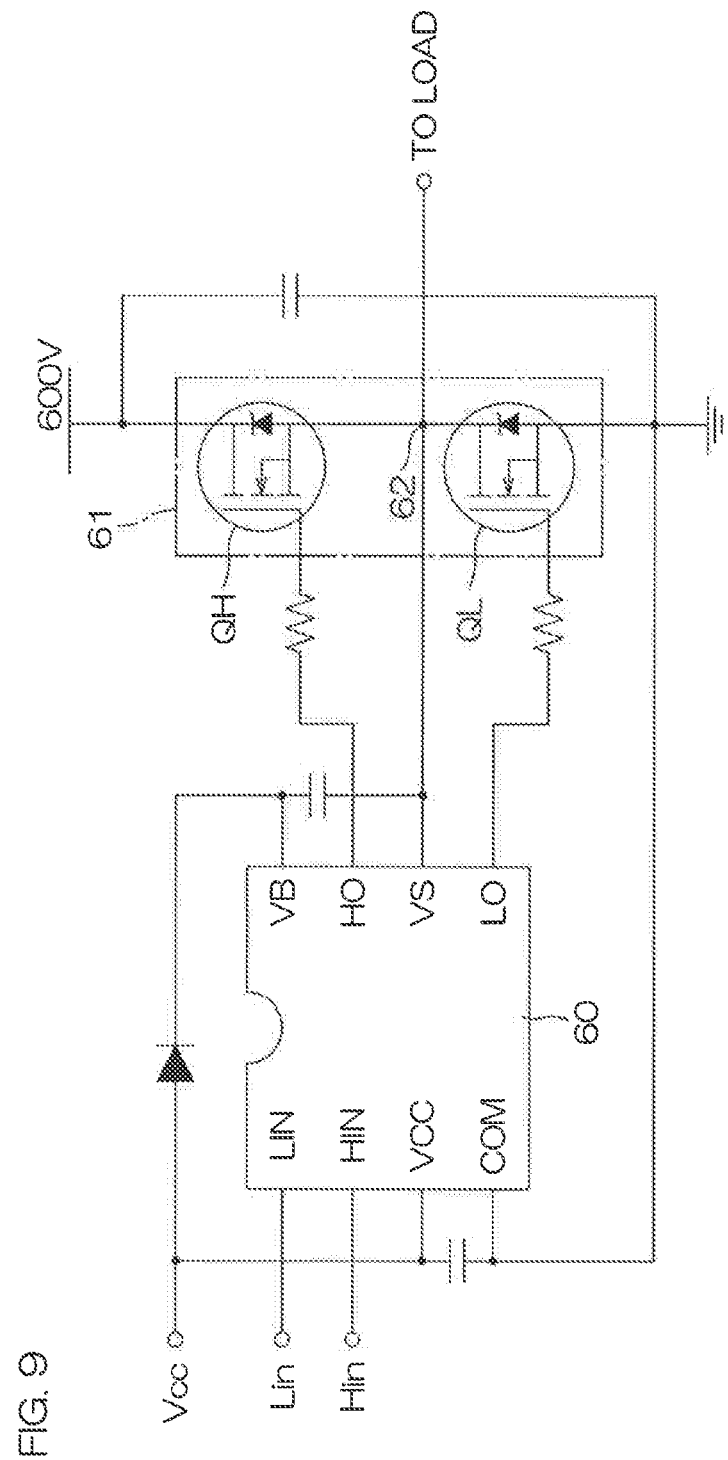
FIG. 9 shows a circuit that includes a gate driver IC which is an example of a semiconductor device incorporating an LDMIS region.

FIG. 9 shows a circuit (in the preferred embodiment, a power supply circuit) that includes a gate driver IC 60 which is an example of the semiconductor device incorporating the LDMIS region. The power supply circuit includes a power switching circuit 61 for driving a load. The power switching circuit 61 is formed with a half bridge circuit which includes a high-side power device QH (upper arm) and a low-side power device QL (lower arm) that are connected in series between a high-voltage power supply (for example, 600 V or less) and a ground potential. The load is connected to a connection point 62 between the pair of power devices QH an QL. The power devices QH and QL are, for example, switching elements such as a power MOSFET (Metal-Oxide-Semiconductor Field-Effect Transistor) and an IGBT (Insulated-Gate Bipolar Transistor). The gate driver IC 60 is operated by a control voltage $V_{CC}$ fed from a control voltage power supply, and inputs an on/off control signal to the gates of the power devices QH and QL.

The gate driver IC 60 includes a high-side gate drive signal output terminal HO which is connected to the gate of the high-side power device QH, a low-side gate drive signal output terminal LO which is connected to the gate of the low-side power device QL, a high-side drive signal input terminal HIN to which a logic input signal Hin corresponding to the high-side gate drive signal output terminal HO is input, and a low-side drive signal input terminal LIN to which a logic input Lin corresponding to the low-side gate drive signal output terminal LO is input. The gate driver IC 60 further includes a high-side floating power supply terminal VB, a high-side floating return terminal VS, a low-side power supply terminal VCC, and a low-side return terminal COM.

Figure 10:
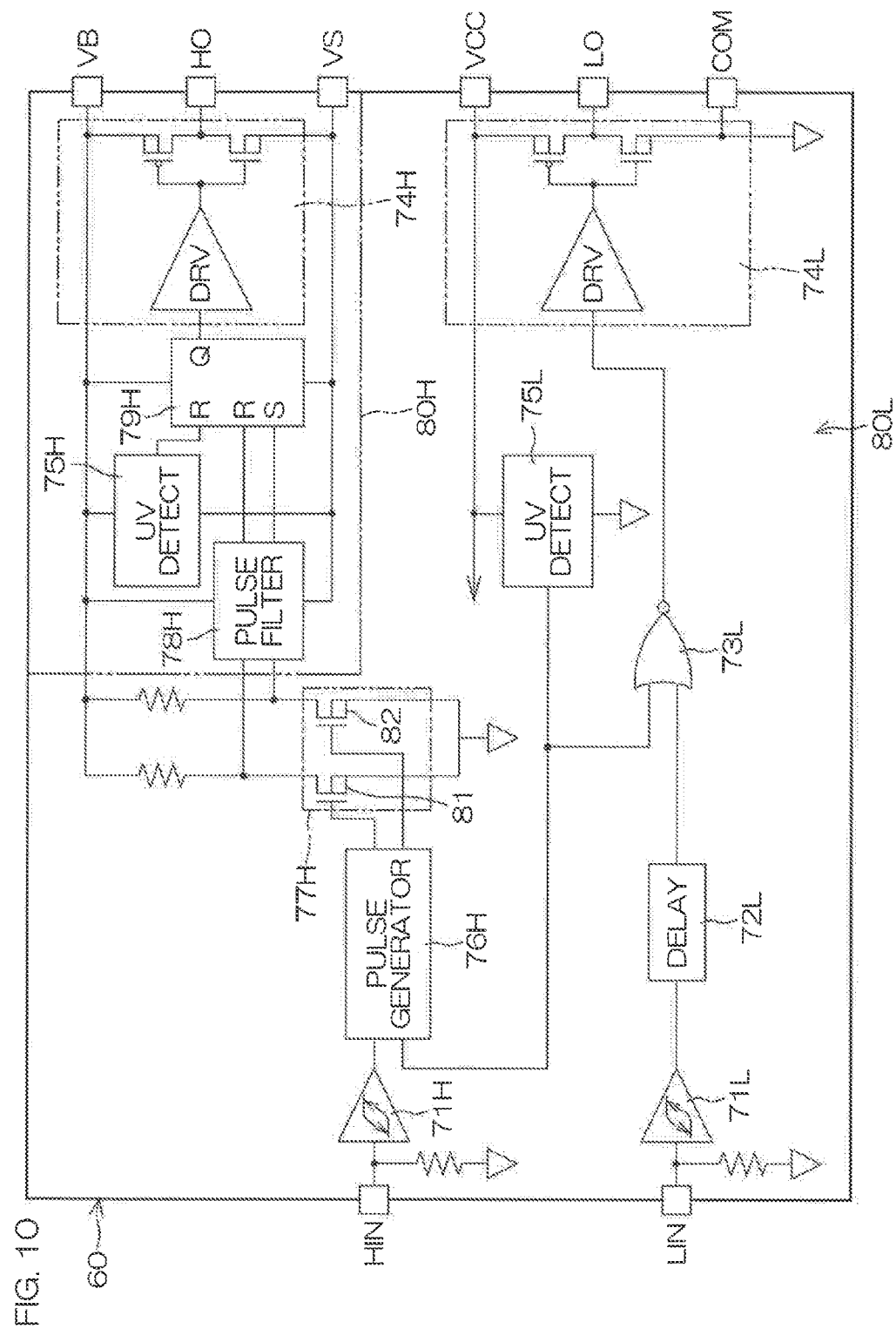
FIG. 10 shows an example of an electrical circuit that is included within the gate driver IC.

FIG. 10 shows an example of an electrical circuit included within the gate driver IC 60. The internal circuit of the gate driver IC 60 includes, corresponding to the low-side gate drive signal input terminal LIN, a Schmitt trigger 71L, a delay circuit 72L, a NOR gate 73L, a low-side current buffer circuit 74L and a low-voltage detection circuit 75L. The internal circuit of the gate driver IC 60 further includes, corresponding to the high-side gate drive signal input terminal HIN, a Schmitt trigger 71H, a pulse generator 76H, a high-voltage level shifter 77H, a pulse filter 78H, an SR flip-flop 79H, a high-side current buffer circuit 74H and a low-voltage detection circuit 75H. The pulse filter 78H, the SR flip-flop 79H, the high-side current buffer circuit 74H and the low-voltage detection circuit 75H constitute a high-side circuit 80H which has a relatively high operation voltage. On the other hand, the Schmitt triggers 71L and 71H, the delay circuit 72L, the NOR gate 73L, the low-side current buffer circuit 74L, the low-voltage detection circuit 75L and the pulse generator 76H constitute a low-side circuit 80L which has a relatively low operation voltage. The low-side circuit 80L is a circuit which is operated with a reference potential of 0 V whereas the high-side circuit 80H is a circuit which is operated while a reference potential is varied from zero to a few hundred volts. The high-voltage level shifter 77H is a level shift circuit which interfaces an input-side circuit (circuit included in the low-side circuit 80L) and the high-side circuit 80H, and has the function of transmitting a signal from the low-side circuit 80L to the high-side circuit 80H.

In the high-voltage level shifter 77H, for example, two high-breakdown voltage NDMOSs (N-channel type Diffused MOSs) 81 and 82 are used. These high-breakdown voltage NDMOSs 81 and 82 can be respectively formed with two LDMIS regions.

Figure 11:
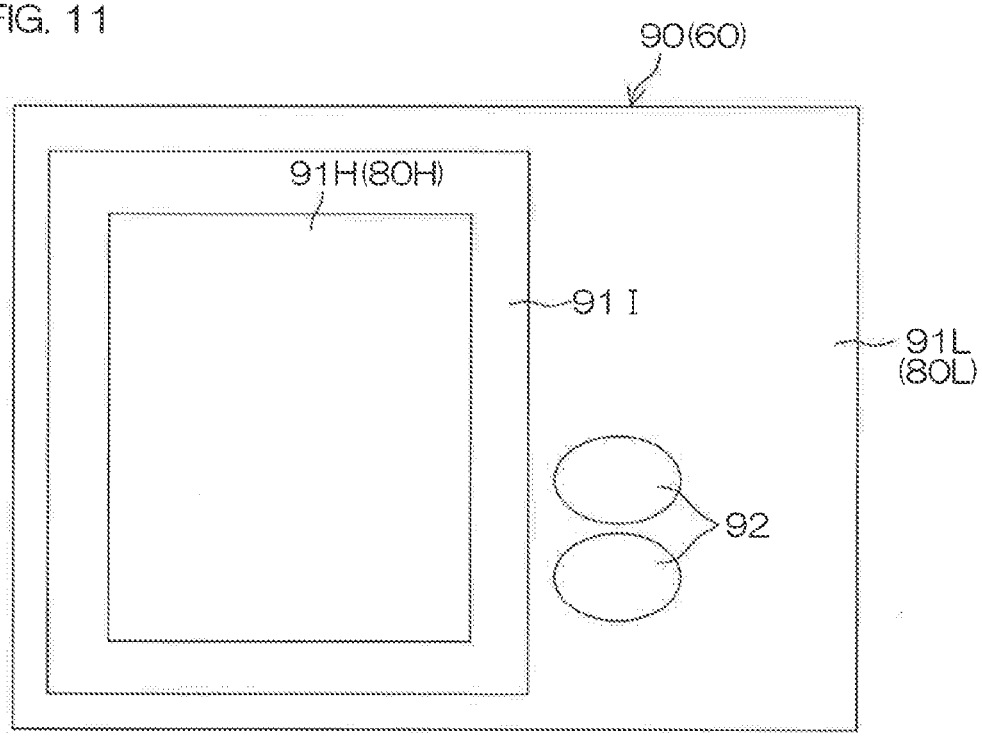
FIG. 11 shows an example of a region arrangement within a semiconductor chip constituting the gate driver IC.

FIG. 11 shows an example of a region arrangement within a semiconductor chip 90 constituting the gate driver IC 60. The semiconductor chip 90 includes a high-side region 91H in which the high-side circuit 80H is formed, a low-side region 91L in which the low-side circuit 80L is formed, and two LDMIS regions 92 in which the high-voltage level shifter 77H is constituted. The high-side region 91H is arranged so as to be surrounded by the low-side region 91L and is electrically separated from the low-side region 91L. Specifically, in a boundary portion between the high-side region 91H and the low-side region 91L, a separation region 91I which separates the regions from each other is arranged. The separation region 91I may be formed by a dielectric or insulator, or may be formed by a p-n junction. The separation region 91I is formed in the shape of a continuous ring so as to surround the high-side region 91H in plan view. The two LDMIS regions 92 are arranged close to each other within the low-side region 91L, that is, outside the high-side region 91H. More specifically, the two LDMIS regions 92 are arranged in the vicinity of the high-side region 91H within the low-side region 91L.

Figure 12:
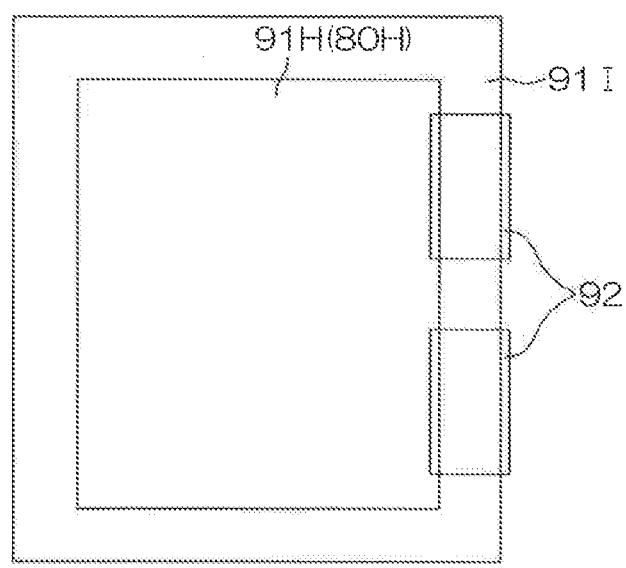
FIG. 12 shows another example of the region arrangement within the semiconductor chip constituting the gate driver IC.

FIG. 12 shows another example of the region arrangement within the semiconductor chip 90 constituting the gate driver IC 60. The high-side region 91H is arranged so as to be surrounded by the low-side region 91L. In the boundary portion between the high-side region 91H and the low-side region 91L, a separation region 91I which separates the regions from each other is arranged. The separation region 91I may be formed by a dielectric or insulator, or may be formed by a p-n junction. The separation region 91I is formed in the shape of a continuous ring so as to surround the high-side region 91H in plan view. Two LDMIS regions 92 are each arranged as straddling the separation region 91I. For example, the LDMIS region 92 may have a structure as shown in FIG. 8, and may be arranged such that the drain is arranged on the high-side region 91H side, that the source is arranged on the low-side region 91L side, and that the region between the source and drain is arranged in the separation region 91I.

In addition to the preferred embodiments described above, various types of design modifications can be performed within the scope of claims.

This application corresponds to Japanese Patent Application No. 2015-095988 filed in the Japan Patent Office on May 8, 2015 and Japanese Patent Application No. 2016-086419 filed in the Japan Patent Office on Apr. 22, 2016 the entire disclosures of which are incorporated herein by reference.

Although the preferred embodiments of the present invention are described in detail, these are merely specific examples used for clarifying the technical details of the present invention, the present invention should not be interpreted by being limited to these specific examples and the scope of the present invention is limited only by the scope of claims attached.

What is claimed is:

1. A semiconductor device comprising:
    a first conductivity type semiconductor substrate;
    a second conductivity type semiconductor layer which is formed on the semiconductor substrate so as to be in contact with the semiconductor substrate;
    a first conductivity type body region which is formed in a front surface portion of the semiconductor layer;
    a second conductivity type source region which is formed, in a front surface portion of the body region, apart from a circumferential edge of the body region;
    a second conductivity type drain region which is formed, in the front surface portion of the semiconductor layer, apart from the body region;
    a gate insulating film which is formed in a front surface of the semiconductor layer so as to be in contact with the body region between the drain region and the source region;
    a thick insulating film which is formed integrally with the gate insulating film so as to cover the semiconductor layer between the gate insulating film and the drain region and which has a thickness greater than a thickness of the gate insulating film; and a gate electrode which is opposite to the body region via the gate insulating film between the source region and the drain region, wherein the body region includes a first portion in which a boundary with the semiconductor layer is in contact with the gate insulating film and a second portion in which a boundary with the semiconductor layer is in contact with the thick insulating film, and the first portion and the second portion of the body region are formed in a portion between the source region and the drain region in the body region.

2. The semiconductor device according to claim 1, wherein the second portion of the body region is formed in a portion other than a portion between the source region and the drain region in the body region.

3. The semiconductor device according to claim 2, wherein a plurality of the second portions are formed.

4. The semiconductor device according to claim 1, wherein a plurality of the first portions and the second portions are alternately formed in the portion between the source region and the drain region in the body region.

5. The semiconductor device according to claim 1, wherein the body region is formed in a shape of a ring in plan view when viewed from a normal direction to the front surface of the semiconductor layer.

6. The semiconductor device according to claim 1, wherein the body region is formed, in plan view when viewed from a normal direction to the front surface of the semiconductor layer, in a shape of an oval ring which has a pair of straight parts parallel to each other and a pair of curved parts respectively continuous to both ends of the pair of straight parts, the source region is formed along at least one of the straight parts of the body region, and the second portion of the body region is formed along at least one of the curved parts.

7. A semiconductor device comprising:

a first conductivity type semiconductor substrate;

a second conductivity type semiconductor layer which is formed on the semiconductor substrate so as to be in contact with the semiconductor substrate;

a first conductivity type body region which is formed in a front surface portion of the semiconductor layer;

a second conductivity type source region which is formed, in a front surface portion of the body region, apart from a circumferential edge of the body region;

a second conductivity type drain region which is formed, in the front surface portion of the semiconductor layer, apart from the body region;

a gate insulating film which is formed in a front surface of the semiconductor layer so as to be in contact with the body region between the drain region and the source region;

a thick insulating film which is formed integrally with the gate insulating film so as to cover the semiconductor layer between the gate insulating film and the drain region and which has a thickness greater than a thickness of the gate insulating film; and a gate electrode which is opposite to the body region via the gate insulating film between the source region and the drain region, wherein the body region includes a first portion in which a boundary with the semiconductor layer is in contact with the gate insulating film and a second portion in which a boundary with the semiconductor layer is in contact with the thick insulating film, the body region is formed, in plan view when viewed from a normal direction to the front surface of the semiconductor layer, in a shape of an oval ring which has a pair of straight parts parallel to each other and a pair of curved parts respectively continuous to both ends of the pair of straight parts, the source region is formed along at least one of the straight parts of the body region, the second portion of the body region is formed along at least one of the curved parts, and the second portion of the body region is formed so as to straddle at least a boundary between the straight part and the curved part in the body region.

8. The semiconductor device according to claim 1, wherein a plurality of the source regions are formed in the front surface portion of the body region.

9. The semiconductor device according to claim 1, wherein the body region and the source region are formed in a shape of a ring in plan view when viewed from a normal direction to the front surface of the semiconductor layer.

10. The semiconductor device according to claim 9, wherein a plurality of the first portions and a plurality of the second portions are formed.

11. The semiconductor device according to claim 9, wherein a plurality of the second portions are formed apart from each other such that a plurality of the first portions are arranged at regular intervals.

12. The semiconductor device according to claim 1, wherein the gate electrode is continuously formed from a top of the gate insulating film to a top of the thick insulating film, and the boundary with the semiconductor layer in the second portion is located between the gate insulating film and an end portion of the gate electrode on a side of the drain region.

13. A semiconductor device comprising:

a first conductivity type semiconductor substrate;

a second conductivity type semiconductor layer which is formed on the semiconductor substrate so as to be in contact with the semiconductor substrate;

a first conductivity type body region which is formed in a front surface portion of the semiconductor layer;

a second conductivity type source region which is formed, in a front surface portion of the body region, apart from a circumferential edge of the body region;

a second conductivity type drain region which is formed, in the front surface portion of the semiconductor layer, apart from the body region;

a gate insulating film which is formed in a front surface of the semiconductor layer so as to be in contact with the body region between the drain region and the source region;

a thick insulating film which is formed integrally with the gate insulating film so as to cover the semiconductor layer between the gate insulating film and the drain region and which has a thickness greater than a thickness of the gate insulating film;

a gate electrode which is opposite to the body region via the gate insulating film between the source region and the drain region; and a source wiring which is formed, in plan view when viewed from a normal direction to the front surface of the semiconductor layer, so as to cross the body region and which is electrically connected to the source region, wherein the body region includes a first portion in which a boundary with the semiconductor layer is in contact with the gate insulating film and a second portion in which a boundary with the semiconductor layer is in contact with the thick insulating film, and the second portion of the body region is formed, in the plan view, in a portion where at least a circumferential edge of the source wiring crosses the body region.

14. The semiconductor device according to claim 1, further comprising:
a drain wiring which is formed, in plan view when viewed from a normal direction to the front surface of the semiconductor layer, so as to cross the body region and which is electrically connected to the drain region,
wherein the second portion of the body region is formed, in the plan view, in a portion where at least a circumferential edge of the drain wiring crosses the body region.

15. The semiconductor device according to claim 1, wherein the second portion of the body region has an impurity concentration different from an impurity concentration of the first portion of the body region.

16. The semiconductor device according to claim 1, wherein the body region has an impurity concentration distribution in which an impurity concentration of an intermediate portion in a thickness direction extending from the front surface portion to a bottom portion of the body region is lowest.

17. The semiconductor device according to claim 1, wherein the body region includes a first high-concentration region formed in the front surface portion, a second high-concentration region formed in the bottom portion, and a low-concentration region which is interposed between the first high-concentration region and the second high-concentration region and which has an impurity concentration lower than impurity concentrations of the first high-concentration region and the second high-concentration region.

18. The semiconductor device according to claim 17, wherein the first portion of the body region includes the first high-concentration region, the second high-concentration region and the low-concentration region, and
the second portion of the body region includes the low-concentration region drawn from between the first high-concentration region and the second high-concentration region to the front surface portion of the semiconductor layer.

19. A semiconductor device comprising:
a first conductivity type semiconductor substrate;
a second conductivity type semiconductor layer which is formed on the semiconductor substrate so as to be in contact with the semiconductor substrate;
a first conductivity type body region which is formed in a front surface portion of the semiconductor layer;
a second conductivity type source region which is formed, in a front surface portion of the body region, apart from a circumferential edge of the body region;
a second conductivity type drain region which is formed, in the front surface portion of the semiconductor layer, apart from the body region;
a gate insulating film which is formed in a front surface of the semiconductor layer so as to be in contact with the body region between the drain region and the source region;
a thick insulating film which is formed integrally with the gate insulating film so as to cover the semiconductor layer between the gate insulating film and the drain region and which has a thickness greater than a thickness of the gate insulating film;
a gate electrode which is opposite to the body region via the gate insulating film between the source region and the drain region; and
a first conductivity type RESURF layer which is formed in a portion in contact with the thick insulating film in the semiconductor layer and which has an impurity concentration lower than an impurity concentration of the semiconductor layer,
wherein the body region includes a first portion in which a boundary with the semiconductor layer is in contact with the gate insulating film and a second portion in which a boundary with the semiconductor layer is in contact with the thick insulating film, and
the second portion of the body region is formed so as to be in contact with the RESURF layer.

20. The semiconductor device according to claim 19, wherein the first portion of the body region is formed so as to be opposite to the RESURF layer across part of the semiconductor layer.

21. A gate driver comprising:
a first conductivity type semiconductor substrate;
a low-side circuit which is formed in a low-side region on the semiconductor substrate;
a high-side circuit which is formed in a high-side region separated from the low-side region on the semiconductor substrate and which has an operation voltage higher than an operation voltage of the low-side circuit; and
a level shift circuit which is formed on the semiconductor substrate and which is connected to the high-side circuit,
wherein the level shift circuit includes:
a second conductivity type semiconductor layer which is formed on the semiconductor substrate so as to be in contact with the semiconductor substrate;
a first conductivity type body region which is formed in a front surface portion of the semiconductor layer;
a second conductivity type source region which is formed, in a front surface portion of the body region, apart from a circumferential edge of the body region;
a second conductivity type drain region which is formed, in the front surface portion of the body region, apart from the body region;
a gate insulating film which is formed in a front surface of the semiconductor layer so as to be in contact with the body region between the drain region and the source region;
a thick insulating film which is formed integrally with the gate insulating film so as to cover the semiconductor layer between the gate insulating film and the drain region and which has a thickness greater than a thickness of the gate insulating film; and
a gate electrode which is opposite to the body region via the gate insulating film between the source region and the drain region,
wherein the body region includes a first portion in which a boundary with the semiconductor layer is in contact with the gate insulating film and a second portion in which a boundary with the semiconductor layer is in contact with the thick insulating film, and
the first portion and the second portion of the body region are formed in a portion between the source region and the drain region in the body region.

22. The gate driver according to claim 21,
wherein the level shift circuit is arranged outside the high-side region.

23. The gate driver according to claim 22, further comprising:
a separation region which is formed on the semiconductor substrate and which separates the low-side region and the high-side region,
wherein the level shift circuit is arranged outside the separation region.

24. The gate driver according to claim 22, further comprising:
a separation region which is formed on the semiconductor substrate and which separates the low-side region and the high-side region,
wherein at least a portion of the level shift circuit is arranged in the separation region.

\* \* \* \* \*